(12) United States Patent
Hwang et al.

(10) Patent No.: US 11,610,959 B2
(45) Date of Patent: Mar. 21, 2023

(54) SENSOR PACKAGE MODULE AND ORGANIC LIGHT-EMITTING DISPLAY DEVICE HAVING SAME

(71) Applicant: LG Display Co., Ltd., Seoul (KR)

(72) Inventors: JongHee Hwang, Gyeonggi-do (KR); BuYeol Lee, Gyeonggi-do (KR); EunJung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/711,208

(22) Filed: Dec. 11, 2019

(65) Prior Publication Data

US 2020/0194515 A1 Jun. 18, 2020

(30) Foreign Application Priority Data

Dec. 17, 2018 (KR) .................. 10-2018-0163185

(51) Int. Cl.
*H01L 51/52* (2006.01)
*H01L 27/32* (2006.01)
*G09G 3/3233* (2016.01)

(52) U.S. Cl.
CPC ........ *H01L 27/3276* (2013.01); *H01L 27/326* (2013.01); *H01L 27/3246* (2013.01);
(Continued)

(58) Field of Classification Search
CPC ............. H01L 27/3276; H01L 27/3246; H01L 27/326; H01L 27/3227; H01L 27/323;
(Continued)

(56) References Cited

U.S. PATENT DOCUMENTS 10,217,803 B2 * 2/2019 Ryu .................... H01L 27/3227
2018/0225500 A1 * 8/2018 Han .................... H01L 27/3227
(Continued)

FOREIGN PATENT DOCUMENTS

CN 103824871 A 5/2014
CN 107968863 A 4/2018
(Continued)

OTHER PUBLICATIONS

Chinese Office Action dated Mar. 1, 2022 issued in Patent Application No. 201911251638.1 w/English Translation (17 pages).
(Continued)

*Primary Examiner* — Phat X Cao
*Assistant Examiner* — Diana C Vieira
(74) *Attorney, Agent, or Firm* — Polsinelli PC

(57) ABSTRACT

An organic light-emitting display device comprises a display panel having a transmission area through which external light passes, and a non-transmission area having transmittance lower than that of the transmission area; a data driver supplying a data signal to the display panel; a gate driver supplying a gate signal to the display panel; a timing controller controlling the data driver and the gate driver; and a sensor package module disposed on a rear surface of the display panel and disposed to correspond to the transmission area, wherein the number of conductive films stacked in the transmission area is smaller than that of conductive films stacked in the non-transmission area.

16 Claims, 16 Drawing Sheets

(52) U.S. Cl.
CPC ...... *H01L 27/3258* (2013.01); *H01L 51/5253* (2013.01); *G09G 3/3233* (2013.01); *H01L 27/323* (2013.01); *H01L 27/3227* (2013.01); *H01L 2227/32* (2013.01)

(58) Field of Classification Search
CPC ............ H01L 27/3258; H01L 51/5253; G09G 3/3233
See application file for complete search history.

(56) References Cited

U.S. PATENT DOCUMENTS

| | | | | |
|---|---|---|---|---|
| 2019/0115415 A1* | 4/2019 | Choi | ............... | G09G 3/3233 |
| 2019/0214596 A1* | 7/2019 | Park | ............... | H01L 27/3276 |
| 2019/0319212 A1* | 10/2019 | Park | ............... | H01L 27/3276 |
| 2020/0044006 A1* | 2/2020 | Lee | ............... | H01L 27/3276 |
| 2020/0058728 A1* | 2/2020 | Song | ............... | H01L 27/3276 |
| 2020/0064968 A1* | 2/2020 | Kim | ............... | H01L 27/323 |
| 2020/0073500 A1* | 3/2020 | Jeong | ............... | H01L 27/3244 |
| 2020/0083475 A1* | 3/2020 | Kang | ............... | H01L 51/5237 |
| 2020/0098843 A1* | 3/2020 | Jeon | ............... | H01L 27/3258 |
| 2020/0110525 A1* | 4/2020 | Park | ............... | H01L 27/3244 |
| 2020/0133415 A1* | 4/2020 | Choi | ............... | G06F 3/04164 |
| 2020/0133438 A1* | 4/2020 | Kim | ............... | G06F 3/0446 |
| 2020/0135800 A1* | 4/2020 | Seo | ............... | H01L 33/56 |
| 2020/0144352 A1* | 5/2020 | Lee | ............... | G09G 3/3225 |
| 2020/0168671 A1* | 5/2020 | Jang | ............... | H01L 51/5253 |
| 2020/0175918 A1* | 6/2020 | An | ............... | H01L 27/3276 |
| 2020/0176526 A1* | 6/2020 | Yoon | ............... | H01L 27/3276 |
| 2020/0176527 A1* | 6/2020 | An | ............... | G09G 3/3225 |
| 2020/0176538 A1* | 6/2020 | Um | ............... | H01L 27/3276 |
| 2020/0176539 A1* | 6/2020 | Sung | ............... | G09G 3/3233 |
| 2020/0176542 A1* | 6/2020 | Park | ............... | H01L 27/3276 |
| 2020/0176551 A1* | 6/2020 | Park | ............... | H01L 27/3265 |
| 2020/0176657 A1* | 6/2020 | Jang | ............... | H01L 27/3276 |
| 2020/0176709 A1* | 6/2020 | Moon | ............... | H01L 51/5221 |
| 2020/0210012 A1* | 7/2020 | Kim | ............... | G06F 3/0412 |
| 2020/0235180 A1* | 7/2020 | Park | ............... | H01L 27/3276 |
| 2020/0235187 A1* | 7/2020 | Bae | ............... | H01L 27/3276 |
| 2020/0243610 A1* | 7/2020 | Han | ............... | H01L 27/326 |
| 2020/0258952 A1* | 8/2020 | Bok | ............... | H01L 51/5246 |
| 2020/0265783 A1* | 8/2020 | Lee | ............... | H01L 27/3276 |

FOREIGN PATENT DOCUMENTS

| | | |
|---|---|---|
| CN | 108254954 A | 7/2018 |
| CN | 108364957 A | 8/2018 |
| CN | 108418911 A | 8/2018 |
| CN | 108494897 A | 9/2018 |
| CN | 108538206 A | 9/2018 |
| CN | 108551505 A | 9/2018 |
| CN | 110189706 A | 8/2019 |
| CN | 110838507 A | 2/2020 |
| CN | 111261084 A | 6/2020 |
| JP | 2017-167203 A | 9/2017 |
| KR | 10-2014-0086708 A | 7/2014 |
| KR | 10-2017-0066767 A | 6/2017 |
| KR | 10-2017-0141311 A | 12/2017 |

OTHER PUBLICATIONS

Chinese Office Action dated Aug. 11, 2022 issued in counterpart Patent Application No. 201911251638.1 w/English Translation (13 pages).

* cited by examiner

SENSOR PACKAGE MODULE AND ORGANIC LIGHT-EMITTING DISPLAY DEVICE HAVING SAME

CROSS REFERENCE TO RELATED APPLICATION

This application claims priority to Korean Patent Application No. 10-2018-0163185, filed on Dec. 17, 2018, which is hereby incorporated by reference in its entirety.

BACKGROUND

Field of the Disclosure

The present disclosure relates to an organic light-emitting display device having a sensor package module.

Description of the Background

With the development of the information society, demand for a variety of types of display devices for displaying images is increasing. In this regard, flat panel display devices, such as liquid crystal display (LCD) devices, and organic light-emitting (OLED) display devices, have been provided.

Among flat panel display devices, organic light-emitting display devices have recently come into prominence, since they have superior properties, such as wide viewing angles, excellent contrast ratios, and the like, and can be provided with a thin profile. The organic light-emitting display devices can emit light to reproduce images by supplying a driving current to self-emissive OLEDs.

The display devices include various sensors. In particular, the sensors receive light or emit light to perform proximity processing, or detect the intensity of external light to allow various programs to be executed on display device.

A display device to which a narrow bezel that maximizes the display area while minimizing the non-display area as much as possible has been applied due to easiness in use and recent design trends has been widely developed.

However, since holes must be perforated in the bezel area, such that the sensors can receive or emit light, the application of the narrow bezel to a display device is limited due to the area occupied by the holes.

SUMMARY

Various aspects of the present disclosure provide an organic light-emitting (OLED) display device having a sensor package module for implementing a thin bezel.

According to the present disclosure, an organic light-emitting display device including: a display panel having a transmission area through which external light passes, and a non-transmission area having light transmittance lower than that of the transmission area; a data driver supplying a data signal to the display panel; a gate driver supplying a gate signal to the display panel; a timing controller controlling the data driver and the gate driver; and a sensor package module disposed on a rear surface of the display panel in a position corresponding to the transmission area. The number of conductive films stacked in the transmission area is smaller than that of conductive films stacked in the non-transmission area.

According to the present disclosure, the organic light-emitting display device includes the sensor package module for implementing a thin bezel.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
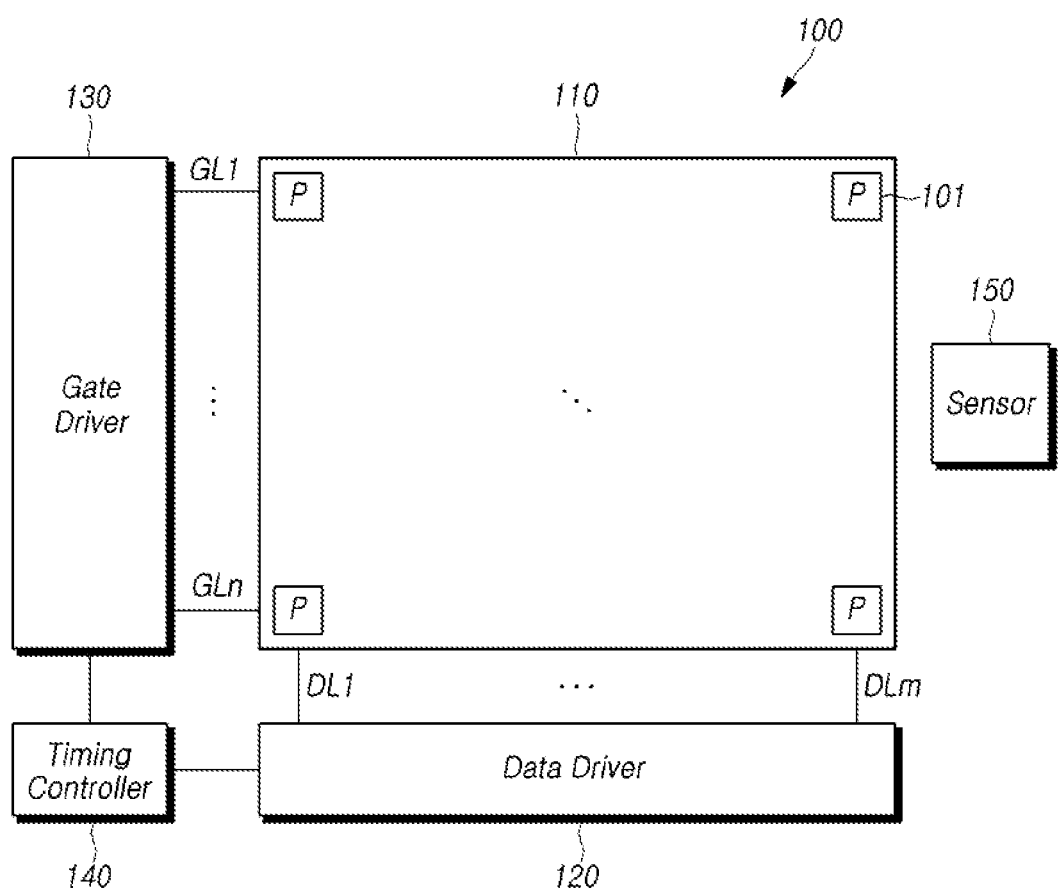
FIG. 1 is a schematic view illustrating a structure of an organic light-emitting display device according to the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a schematic view illustrating a structure of an organic light-emitting display device according to aspects.

Referring to FIG. 1, the organic light-emitting display device (also referred to as the organic light-emitting diode (OLED) display device) 100 may include a display panel 110, a data driver 120, a gate driver 130, a timing controller 140, and a sensor 150.

The display panel 110 can display an image. The display panel 110 may include a transmission area, on which external light is incident, and a non-transmission area having light transmittance lower than that of the transmission area. The number of conductive films stacked in the transmission area may be lower than that of conductive films stacked in the non-transmission area.

In addition, the display panel 110 may include a plurality of gate lines GL1 to GLn extending in a first direction and a plurality of data lines DL1 to DLm extending in a second direction. While the first and second directions intersect each other, aspects are not limited thereto. The display panel 110 includes a plurality of pixels P provided corresponding to an area in which the plurality of gate lines GL1 to GLn and the plurality of data lines DL1 to DLm intersect each other. The plurality of pixels P may include an organic light-emitting diode (OLED; not shown) and a pixel circuit (not shown) for supplying a driving current to the organic light-emitting diode. The pixel circuit may be connected to the gate lines GL1 to GLn and the data lines DL1 to DLm to supply a driving current to the organic light-emitting diodes. Here, the lines disposed in the display panel 110 are not limited to the plurality of gate lines GL1 to GLn and the plurality of data lines DL1 to DLm.

The data driver 120 may apply a data signal to the plurality of data lines DL1 to DLm. The data signal may correspond to the gradation, and a voltage level of the data signal may be determined according to the gradation. The voltage of the data signal may be referred to as a data voltage.

Here, although the data driver 120 is illustrated as being a single data driver, the present disclosure is not limited thereto. Two or more data drivers may be provided, depending on the size and resolution of the display panel 110. In addition, the data driver 120 may be implemented as an integrated circuit.

The gate driver 130 may apply a gate signal to the plurality of gate lines GL1 to GLn. The pixel P corresponding to the plurality of gate lines GL1 to GLn to which the gate signal is applied may receive the data signal. In addition, the gate driver 130 may transfer a sensing signal to the pixel P. The pixel P, having received the sensing signal output from the gate driver 130, may receive a sensing voltage output from the data driver 120. Here, although the gate driver 130 is illustrated as being a single gate driver, the present disclosure is not limited thereto. At least two gate drivers may be provided.

The gate drivers 130 may be disposed on both sides of the display panel 110, respectively, such that one of the gate drivers 130 is connected to the odd-numbered gate lines among the plurality of gate lines GL1 to GLn, and the other of the gate drivers 130 may be connected to even-numbered gate lines among the plurality of gate lines GL1 to GLn. However, the present disclosure is not limited thereto. The gate driver 130 may be implemented as an integrated circuit.

The timing controller 140 may control the data driver 120 and the gate driver 130. In addition, the timing controller 140 may transfer image data, corresponding to the data signal, to the data driver 120. The image data may be a digital signal. The timing controller 140 may correct the image signal and transfer the corrected image signal to the data driver 120. The operation of the timing controller 140 is not limited thereto. The timing controller 140 may be implemented as an integrated circuit.

The sensor 150 can detect light. The sensor 150 can receive external light that has passed through the display panel 110. In addition, the sensor 150 can irradiate the display panel 110 with light. The light irradiated by the sensor 150 towards the transmission area may be infrared radiation. However, the present disclosure is not limited thereto. In addition, the sensor 150 can receive light, such as infrared radiation, emitted outwardly through the display panel 110 and reflected by an external object. The sensor 150 may be disposed on the rear surface of the display panel 110. In addition, the sensor 150 may be disposed corresponding to the transmission area of the display panel 110.

The sensor 150 may be in the form of a module in which devices are included in one package. A single package of a sensor in which a light-receiving element and a light-emitting element are included may be referred to as a sensor package module. The sensor 150 can receive a control signal from an external set. In addition, the sensor 150 can transmit the sensed signal to the set. However, the present disclosure is not limited thereto. The set may be a micro control unit (MCU). Also, the set may be an application processor (AP). However, the present disclosure is not limited thereto.

Figure 2:
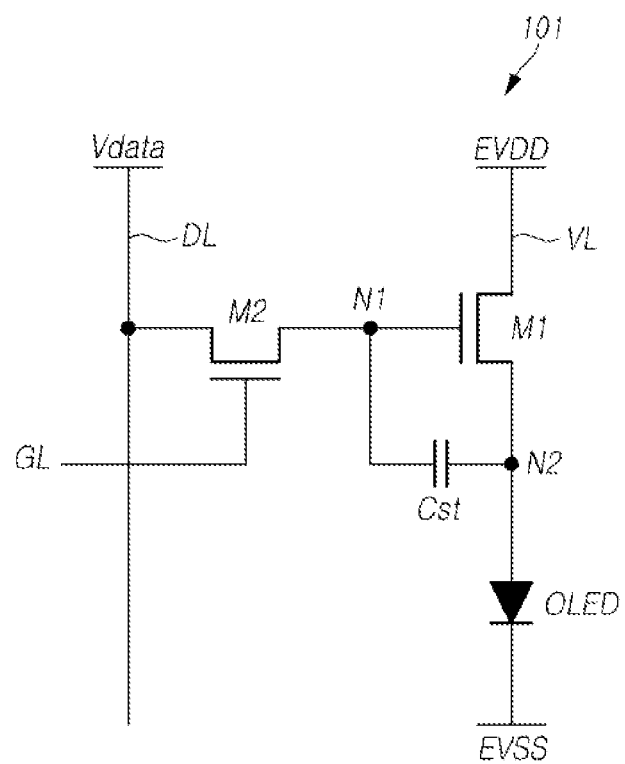
FIG. 2 is a circuit diagram illustrating a pixel in FIG. 1.

FIG. 2 is a circuit diagram illustrating an aspect of the pixel illustrated in FIG. 1.

Referring to FIG. 2, the pixel 101 may include an organic light-emitting diode (OLED) and a pixel circuit for driving the OLED. The pixel circuit may include a first transistor M1, a second transistor M2, and a capacitor Cst.

The first transistor M1 has a first electrode connected to a first power supply line VL, through which power from a first power source EVDD is transferred, a gate electrode connected to a first node N1, and a second electrode connected to a second node N2. The first transistor M1 can cause a current to flow to the second node N1, in response to a voltage being transferred to the second node N2. The first electrode of the first transistor M1 may be a drain electrode and the second electrode may be a source electrode. However, the present disclosure is not limited thereto.

The current flowing to the second node N2 may correspond to the following Equation 1:

$$Id = k(V_{GS} - Vth)^2 \qquad (1)$$

where Id denotes the amount of current flowing through the second node N2, k denotes electron mobility of the transistor, VGS denotes a voltage difference between the gate electrode and the source electrode of the first transistor M1, and Vth denotes a threshold voltage of the first transistor M1.

The second transistor M2 has a first electrode connected to the data line DL, a gate electrode connected to the gate line GL, and a second electrode connected to a first node N1. Thus, the second transistor M2 can generate a data voltage Vdata, corresponding to the data signal to the first node N1, in response to a gate signal being transferred through the gate line GL. The first electrode of the second transistor M2 may be a drain electrode and the second electrode may be a source electrode. However, the present disclosure is not limited thereto.

The capacitor Cs may be connected between the first node N1 and the second node N2. The capacitor Cs can maintain the voltages of the gate electrode and the source electrode of the first transistor M1 constant.

The organic light-emitting diode OLED may have an anode electrode connected to the second node N2 and a cathode electrode connected to a second power source EVSS. Here, the second power source EVSS may supply a voltage lower than a voltage level of the first power source EVDD. The second power source EVSS may be a ground voltage. However, the present disclosure is not limited thereto. When an electric current flows from the anode electrode to the cathode electrode, the organic light-emitting diode (OLED) may emit light depending on the amount of current. The OLED may emit light of any one of red, green, blue, and white. However, the present disclosure is not limited thereto.

The pixel circuit employed in the organic light-emitting display device 100 of FIG. 1 is not limited thereto.

Figure 3A:
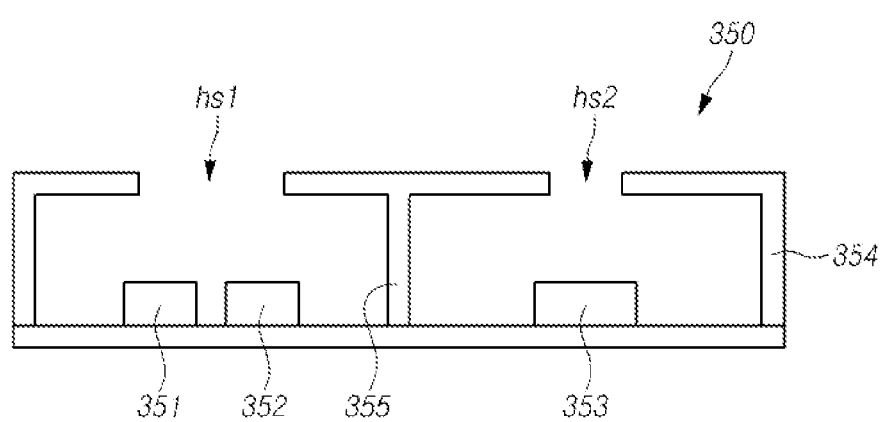
FIG. 3A is a cross-sectional view illustrating a sensor package module employed in the organic light-emitting display device illustrated in FIG. 1.
Figure 3B:
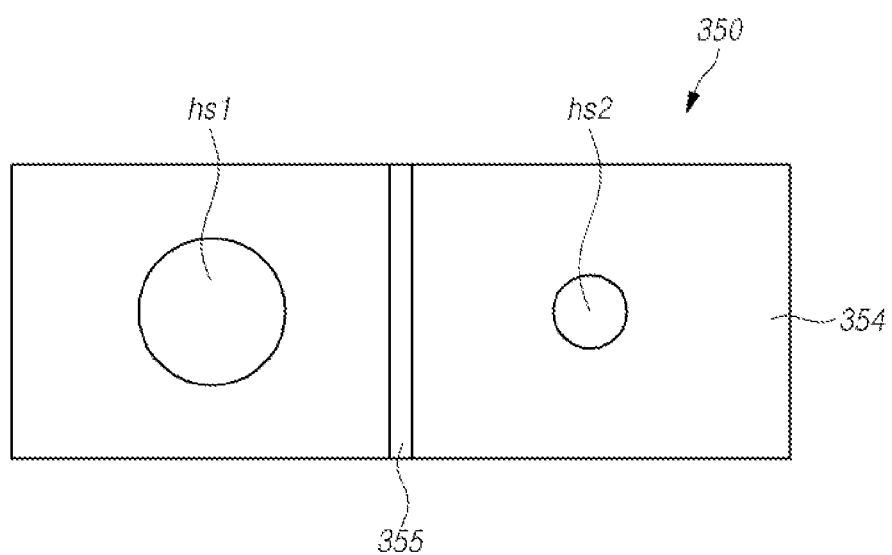
FIG. 3B is a top view illustrating the sensor package module according to the present disclosure.

FIG. 3A is a cross-sectional view illustrating a sensor package module employed in the organic light-emitting display device illustrated in FIG. 1, and FIG. 3B is a top view illustrating the sensor package module according to the present disclosure.

The sensor package module 350 may include a housing 354, light receiving sensors 351 and 352, and a light-emitting element 353. The light receiving sensors 351 and 352 may be a proximity sensor. However, the present disclosure is not limited thereto. Further, the light-emitting element 353 may be an infrared-emitting element. However, the present disclosure is not limited thereto.

The housing 354 can accommodate the light receiving sensors 351 and 352 and the light-emitting element 353 therein. The housing 354 may have a first hole hs1 and a second hole hs2 corresponding to and located above the light receiving sensors 351 and 352 and the light-emitting element 353, accommodated in the housing 354. In addition, the housing 354 may have a partition wall 355 disposed between the light receiving sensors 351 and 352 and the light-emitting element 353.

The partition wall 355 can prevent the light emitted from the light-emitting element 353 from directly striking the light receiving sensors 351 and 352 without passing through the first hole hs1 and the second hole hs2. Each of the first hole hs1 and the second hole hs2 provided in the housing 354 may be a circular hole with a diameter of 1 mm. However, the size and shape of the first hole hs1 and the second hole hs2 are not limited thereto.

The light receiving sensors 351 and 352 and the light-emitting element 353 may be provided on a substrate, and the lower portion of the housing 354 may be the substrate on which lines for supplying signals and/or voltages to the light receiving sensors 351 and 352 and the light-emitting element 353 are provided. However, the present disclosure is not limited thereto.

The light receiving sensors 351 and 352 may include a first light receiving sensor 351 and a second light receiving sensor 352. The first light receiving sensor 351 can receive visible light from natural light and the second light receiving sensor 352 may receive IR radiation. The IR radiation received by the second light receiving sensor 352 may be IR radiation emitted from the light-emitting element 153 and reflected by an object. However, the light received by the light receiving sensors 351 and 352 and emitted from the light-emitting element 353 is not limited thereto.

Figure 4A:
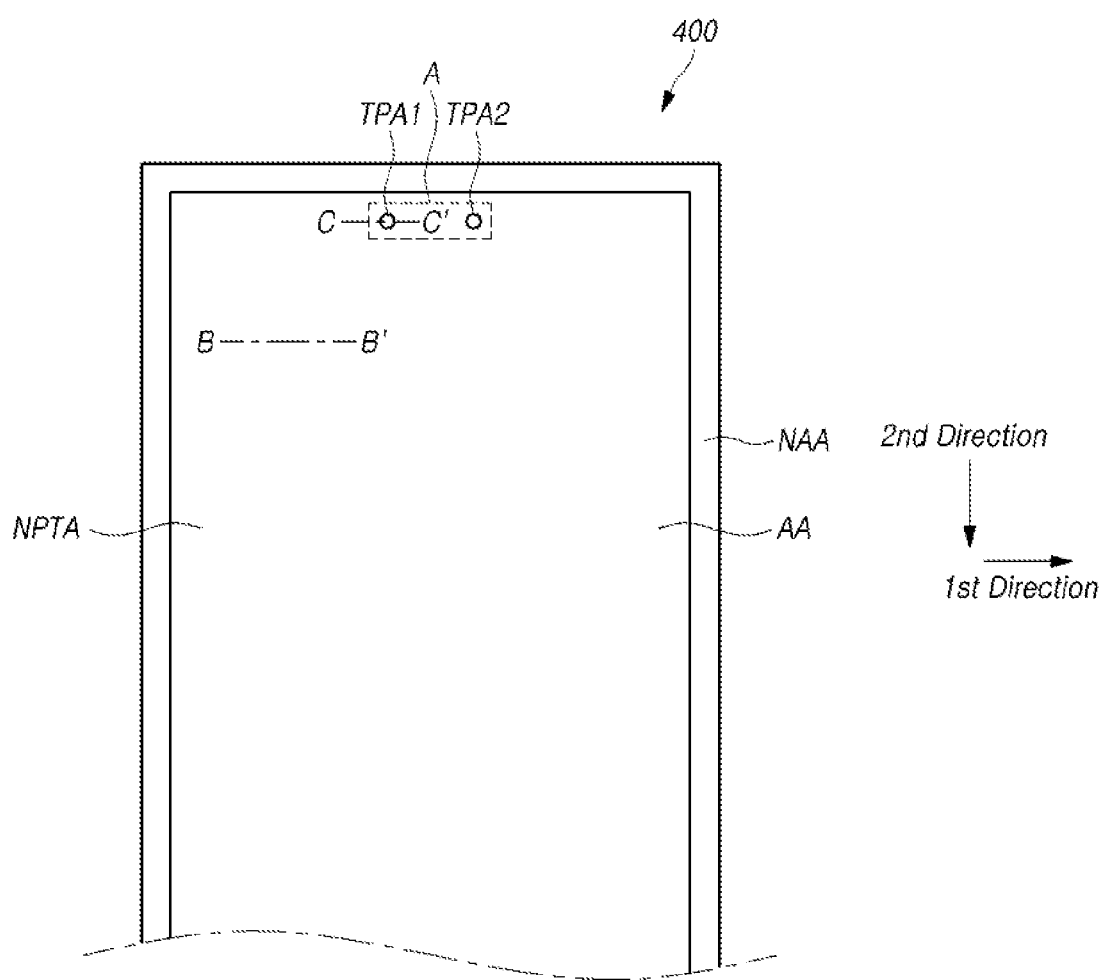
FIG. 4A is a top view illustrating an organic light-emitting display device according to the present disclosure.
Figure 4B:
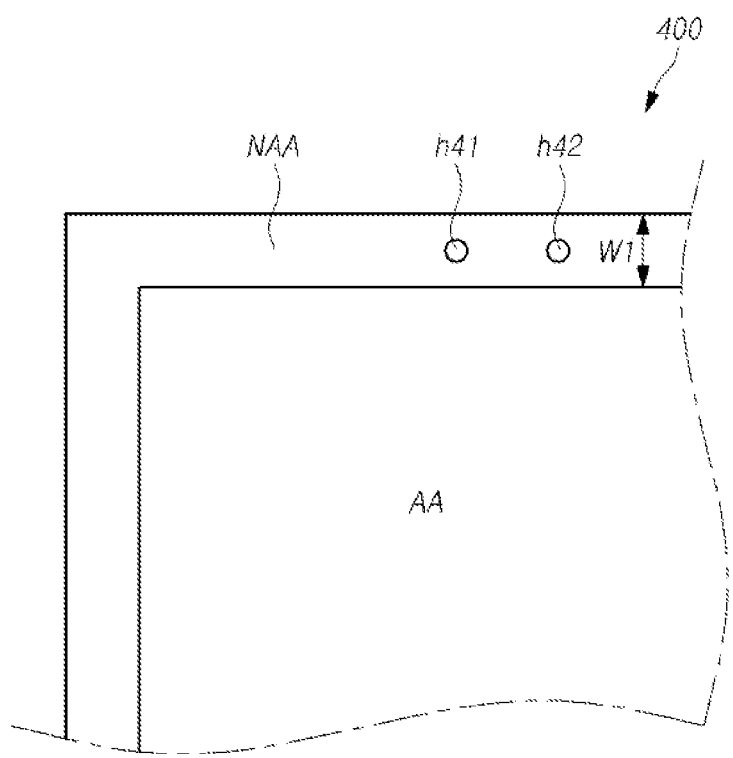
FIG. 4B is a top view illustrating a comparative aspect in which holes are formed in a bezel area according to the present disclosure.

FIG. 4A is a top view illustrating an aspect of the organic light-emitting display device illustrated in FIG. 1, and FIG. 4B is a top view illustrating a comparative aspect in which holes are provided in a bezel area.

Referring to FIGS. 4A and 4B, the OLED display 300 includes an active area AA on which an image is displayed, and a bezel area NAA in which lines or connections (not shown), through which signals and/or voltages are transferred to the active area AA, are disposed. The active area AA may be an area on which the display panel 110 illustrated in FIG. 1 is exposed and an image is displayed, thereby allowing the user to recognize the image therefrom. The bezel area NAA is disposed at the rim of the active area AA and the wirings for applying the signal and/or voltage to the active area AA may be disposed therein. However, the present disclosure is not limited thereto.

Since the light transmittance of the active area AA is generally low, as illustrated in FIG. 4B, holes h41 and h42, through which light is able to pass, may be arranged in the bezel area NAA, and the sensor package module 350 illustrated in FIG. 3A or FIG. 3B may be disposed so as to overlap the holes h41 and h42. The sensor package module 350 can receive/emit light through the holes h41 and h42. However, if the holes h41 and h42 are formed in the bezel area NAA, there is a limit in thinning the width W1 of the bezel area NAA due to the size of the holes h41 and h42.

However, if a portion of the active area AA is designed to allow a sufficient amount of light to pass therethrough, light can pass through the portion of the active area AA and the sensor package module 350 can use the light. Therefore, when a certain area of the active area AA has a predetermined transmittance, the sensor package module 350 may be disposed to overlap the active area AA. Further, it is not necessary to provide holes, through which the sensor package module 350 is irradiated with light, in the bezel area NAA, thereby making it easier to provide a narrow bezel.

In this regard, the active area AA may include the transmission areas TPA1 and TPA2 and the non-transmission area NTPA. The transmission areas TPA1 and TPA2 may have a transmittance of 30% or more with respect to infrared radiation and 10% or more with respect to visible light. The non-transmission area NTPA may have a transmittance of less than 30% with respect to infrared radiation and less than 10% with respect to visible light. However, the present disclosure is not limited thereto. The non-transmission area NTPA may be an area other than the transmission areas TPA1 and TPA2 in the active area AA. However, the present disclosure is not limited thereto. In addition, the infrared radiation may have a wavelength range of 850 to 950 nm, and visible light may have a wavelength range of 525 to 560 nm.

In the organic light-emitting display device 300, the sensor package module 350 illustrated in FIG. 3A or 3B may be disposed on the rear surface of the active area AA in a position corresponding to the active area AA. The sensor package module 350 can sense the light that has passed through the transmission areas TPA1 and TPA2. The transmission areas TPA1 and TPA2 may be two areas having a circular shape in the active area AA. However, the shape and number of the transmission areas TPA1 and TPA2 are not limited thereto. The transmission areas TPA1 and TPA2 may be provided in positions on the active area AA, corresponding to the shape of the first hole hs1 and the second hole hs2 of the sensor package module 350 illustrated in FIG. 3A or 3B. Here, while the transmission areas TPA1 and TPA2 are illustrated as being disposed in the top portion of the active area AA, the present disclosure is not limited thereto.

Figure 5:
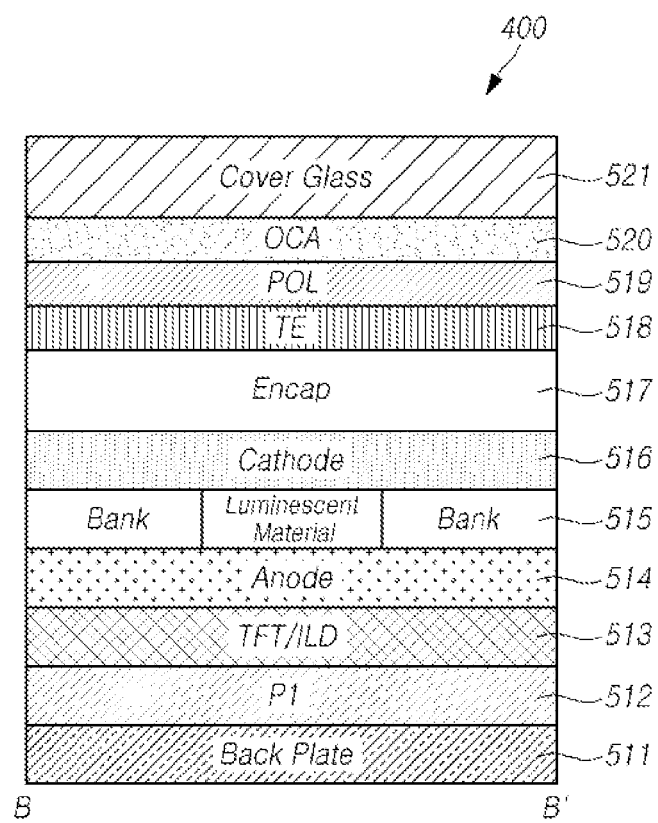
FIG. 5 is a cross-sectional view taken along line B-B' of the organic light-emitting display device illustrated in FIG. 4A.

FIG. 5 is a cross-sectional view taken along line B-B' of the organic light-emitting display device illustrated in FIG. 4A.

Referring to FIG. 5, the organic light-emitting display device 400 may include a substrate 512, an element layer 513 including a transistor disposed on the substrate 512 and elements disposed corresponding to an insulating layer, an anode electrode 514 disposed on the element layer 513, a luminescent layer 515 including a luminescent material and a bank disposed on the anode electrode 514, a cathode electrode layer 516 disposed on the luminescent layer 515, an encapsulation layer 517 disposed on the cathode electrode layer 516, a polarization film 519 disposed on the encapsulation layer 517, an adhesive layer 520 disposed on the polarization film 519, and a glass cover 521 disposed on the adhesive layer 520. A back plate 511 may be disposed on the rear surface of the substrate 512. In addition, the organic light-emitting display device 400 illustrated in FIG. 4A may further include a touch electrode layer 518 corresponding to a touch sensor. Although the touch electrode layer 518 is illustrated as being disposed between the encapsulation layer 517 and the polarization film 519, the present disclosure is not limited thereto.

The back plate 511 may comprise a transparent material, allowing light to pass therethrough. The substrate 512 may include at least one of polyethylene terephthalate (PET), polyamide, or a combination thereof. The element layer 513 may include a conductive layer and an insulation film, from which transistors are formed. The conductive layer contains a metallic material and has low light transmittance. However, the insulation film may include a material having high light transmittance. The metallic material may be, but is not limited to, a low work function material, such as calcium (Ca), aluminum (Al)/lithium (Li), magnesium (Mg)/silver (Ag). However, the present disclosure is not limited thereto.

In addition, the anode electrode 514 may include a metal material. The conductive layer of the element layer 513 and the anode electrode 514 may be disposed in specific positions between the insulation films through patterning. The aperture ratio of the active area AA may be determined in accordance with the ratio of the area of the active area AA, in which the conductive layer and the anode electrode 514 are disposed, to the area of the active area AA, in which none of the conductive layer and the anode electrode 514 are disposed. That is, the transmittance may be determined by the aperture ratio of the element layer 513 and the anode electrode 514. The luminescent layer 515 disposed on the anode electrode 514 electrode may have high transmittance because light can pass therethrough.

On the other hand, the cathode electrode 516 has low transmittance, due to a low transmittance metal material thereof. The encapsulation layer 517, the polarization film 519, the first adhesive layer 520, and the glass cover 521, disposed on the cathode electrode 516, have high transmittance, due to a light transmittance material thereof. That is, the element layer, the anode electrode, and the cathode electrode affect the transmittance of the organic light-emitting display device. When the organic light-emitting display device includes the touch electrode layer 518, the transmittance may not be greatly affected by the shape of the touch electrode 518.

Figure 6:
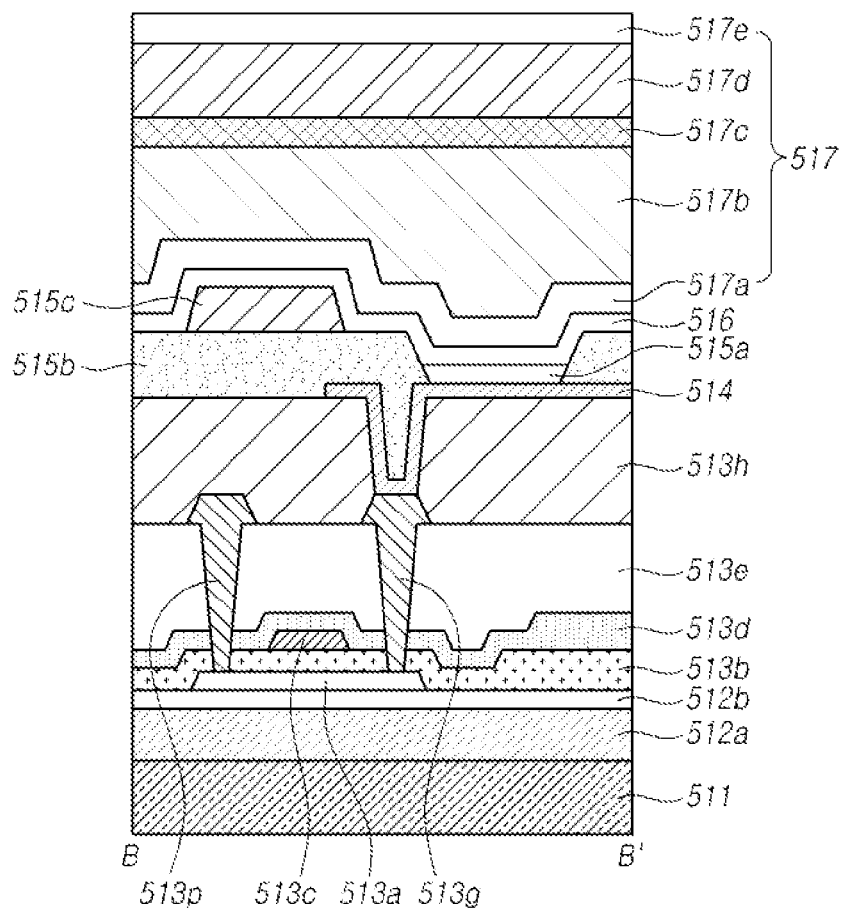
FIG. 6 is another cross-sectional view taken along line B-B' of the organic light-emitting display device illustrated in FIG. 4A.

FIG. 6 is another cross-sectional view taken along line B-B' of the organic light-emitting display device illustrated in FIG. 4A.

Referring to FIG. 6, the non-transmission area NTPA of the organic light-emitting display device 400 may include a back plate 511, a substrate 512a, a buffer layer 512b disposed on the substrate 512a, an active layer 513a patterned and disposed on a portion of the buffer layer 512b, a gate insulation film 513b disposed on the buffer layer 512b and the active layer 513a, a gate electrode 513c patterned and disposed on the gate insulation layer 513b, an interlayer insulation film 513d disposed on the gate electrode 513c and the gate insulation film 513b, a first passivation film 513e patterned and disposed on the interlayer insulation film 513d, a source electrode 513p and a drain electrode 513g patterned and disposed on the first passivation film 513e such that the source electrode and the drain electrode contact the active layer 513a through contact holes, and a first planarization layer 513h disposed on the source electrode 513p, the drain electrode 513g, and the first passivation film 513e.

The non-transmission area NTPA may include an anode electrode 514 patterned and disposed on the first planarization film 513h and connected to the drain electrode 513g through the contact hole, a luminescent material 515a disposed on the anode electrode 514, a bank 515b disposed on the first planarization film 513h with the luminescent material 515a disposed therebetween, a spacer 515c disposed on a region of the bank 515b, and a cathode electrode 516 disposed on the bank 515b and the luminescent material 515a.

In addition, the non-transmission area NTPA may include a second passivation film 517a disposed on the cathode electrode 516, an organic film 517b disposed on the second passivation film 517a, a third passivation film 517c disposed on the organic film 517b, a second adhesive layer 517d disposed on the third passivation film 517c, and a barrier film 517e disposed on the second adhesive layer 517d.

The substrate 512a may comprise a polyamide. However, the present disclosure is not limited thereto. The buffer layer 512b may include a multi-buffer layer and an active buffer layer. The active layer 513a and the gate insulation film 513b, disposed on the substrate 512a, may be disposed on the active buffer layer. The second passivation film 517a, the organic film 517b, the third passivation film 517c, the adhesive layer 517d, and the barrier film 517e may correspond to the encapsulation layer 517 illustrated in FIG. 5. The second passivation film 517a and the third passivation film 517c may be inorganic films. That is, the encapsulation layer 517 may include an organic film and an inorganic film, and may have a structure in which an organic film and an inorganic film are stacked.

The non-transmission area NTPA of the organic light-emitting display device 400 may include the active layer 513a, the gate electrode 513c, the anode electrode 514, the source electrode 513p, the drain electrode 513g, and the cathode electrode 516. In the non-transmission area, a transistor corresponding to the active layer 513a, the gate electrode 513c, the source electrode 513p, and the drain electrode 513g, and the organic light-emitting diode (OLED) corresponding to the anode electrode 514, the cathode electrode 516, and the luminescent material 515a may be disposed. In the organic light-emitting display device 400, a driving current flows through the OLED in response to the operation of the transistor, so that light is emitted from the OLED. However, the active area AA may has a reduced transmittance corresponding to the active layer 513a, the gate electrode 513c, the anode electrode 514, the source electrode 513p, the drain electrode 513g, or the cathode electrode 516. Thus, the transmittance of light irradiated from the outside to the non-transmission area NTPA may be significantly lowered.

Figure 7:
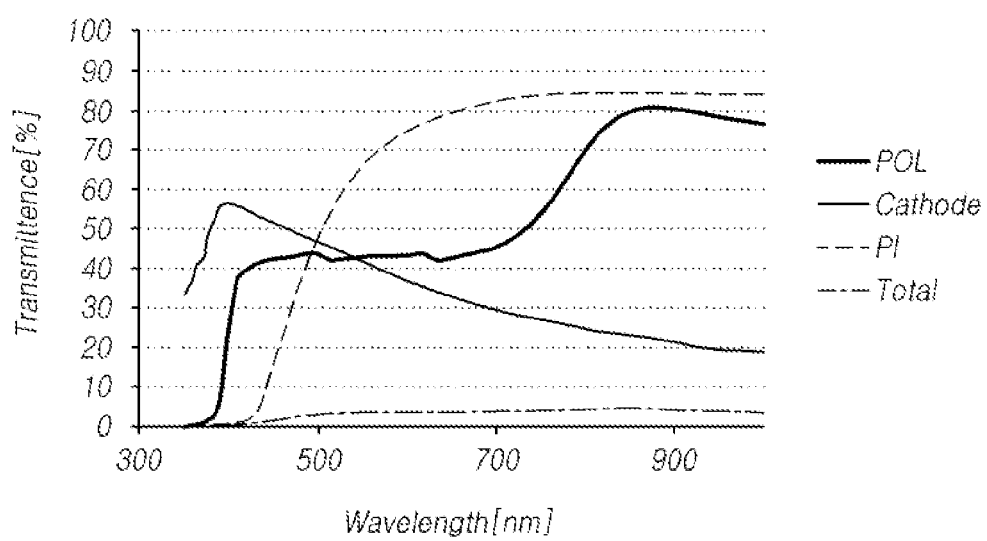
FIG. 7 is a graph illustrating the relationship between the transmittance and wavelength for layers applied to the front surface of a non-transmission area of the organic light-emitting display device illustrated in FIG. 4A.

FIG. 7 is a graph illustrating the relationship between the transmittance and wavelength for layers applied to the front surface of a non-transmission area of the organic light-emitting display device illustrated in FIG. 4A.

Referring to FIG. 7, the curve PI represents the transmittance of the substrate, the curve Cathode represents the transmittance of the cathode electrode, the curve POL represents the transmittance of the polarization film, and the curve Total represents the total transmittance of the organic light-emitting display device. Here, the substrate may include the curve PI. In the curve PI, the substrate exhibits the transmittance of about 60 to 80% for light having a wavelength range of 525 to 560 nm corresponding to that of visible light and the transmittance of 80% or more for light having a wavelength range of 850 to 950 nm corresponding to that of infrared radiation. In the curve Cathode, the cathode electrode exhibits the transmittance of about 0 to 40% for light having a wavelength range of 525 to 560 nm corresponding to that of visible light and the transmittance of about 20% for light having a wavelength range of 850 to 950 nm corresponding to that of infrared radiation. In the curve POL, the polarization film exhibits the transmittance of about 40% for light having a wavelength range of 525 to 560 nm corresponding to that of visible light, and the transmittance of about 20% for light having a wavelength range of 850 to 950 nm corresponding to that of infrared radiation. Finally, the curve Total represents the total transmittance of all of the layers of an organic light-emitting display device, in which the total transmittance amounts to less than 10% with respect to light having the entire wavelength range.

As described above, the transmittance of the non-transmission area NTPA is not suitable for a proximity sensor.

Figure 8:
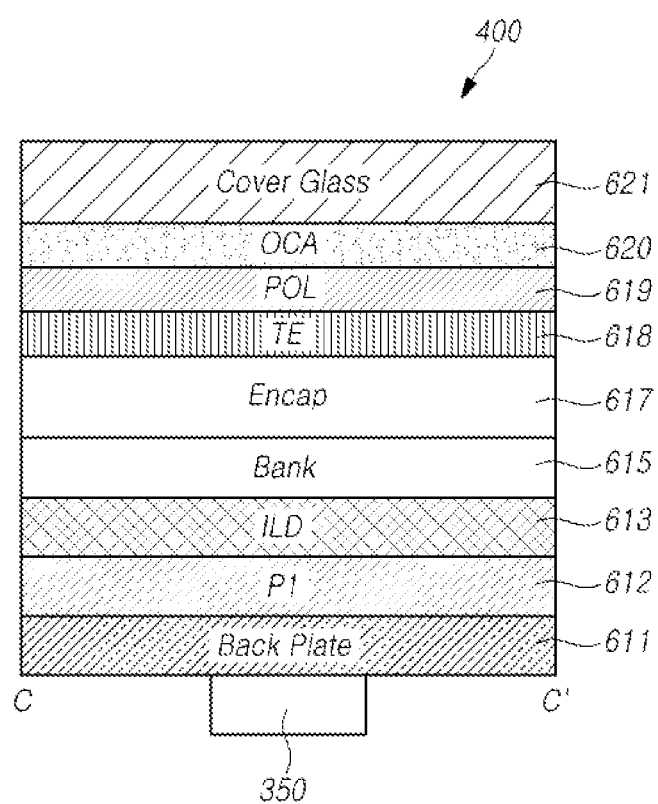
FIG. 8 is a cross-sectional view taken along line C-C' of the organic light-emitting display device illustrated in FIG. 4A.

FIG. 8 is a cross-sectional view taken along line C-C' of the organic light-emitting display device illustrated in FIG. 4A.

Referring to FIG. 8, the organic light-emitting display device 400 may include a substrate 612, an element layer 613 disposed on the substrate 612, a luminescent layer 615 having a bank on the element layer 613, an encapsulation layer 617 disposed on the luminescent layer 615, a polarization film 619 disposed on the encapsulation layer 617, a first adhesive layer 620 disposed on the polarization film 619, and a glass cover 621 disposed on the first adhesive layer 620. A back plate 611 may be disposed on the rear surface of the substrate 612. In addition, a sensor package module 350 may be disposed on the rear surface of the back plate 611.

The Organic light-emitting display device 400 may further include a touch electrode layer 618 corresponding to a touch sensor. Although the touch electrode layer 618 is illustrated as being disposed between the encapsulation layer 617 and the polarization film 619, the present disclosure is not limited thereto. The touch electrode layer 618 may include a plurality of touch electrodes, and some of the touch electrodes disposed corresponding to the transmission area may be removed. This can reduce the amount of light reflected by the touch electrodes, thereby further increasing the transmittance.

In addition, the encapsulation layer 617 may include an organic film, and is different from the encapsulation layer 517 illustrated in FIG. 5 in that an inorganic film is not disposed. The encapsulation layer 617 may have higher transmittance than that of the encapsulation layer 517 illustrated in FIG. 5 because the inorganic film is not disposed on the encapsulation layer 617.

The back plate 611 may comprise a transparent material, allowing light to pass therethrough. The back plate 611 may have holes corresponding to the shapes of the transmission areas TPA1 and TPA2. The substrate 612 may comprise at least one of PET, polyamide, or a combination thereof. The conductive layer for forming a transistor is removed from the element layer 613, and thus, the insulation layer is only provided on the element layer 613. Thus, the element layer 613 may also be referred to as an insulation layer.

Further, the anode electrode 614 may not be disposed to correspond to the shape and position of the transmission areas TPA1 and TPA2. That is, the anode electrode 614 may not be disposed in the transmission areas TPA1 and TPA2. In the same manner, the cathode electrode 616 may not be disposed corresponding to the shape and position of the transmission areas TPA1 and TPA2. That is, in the process of disposing the cathode, the cathode 616 may be disposed not in the transmission areas TPA1 and TPA2, but in the non-transmission area NPTA. However, the present disclosure is not limited thereto. For example, a portion of the cathode electrode 616 may be removed to correspond to the shape of the transmission areas TPA1 and TPA2. Accordingly, the metal material is not disposed in the transmission areas TPA1 and TPA2, and thus, the transmittance of the transmission areas with respect to visible light and infrared radiation can be prevented from being lowered.

Figure 9:
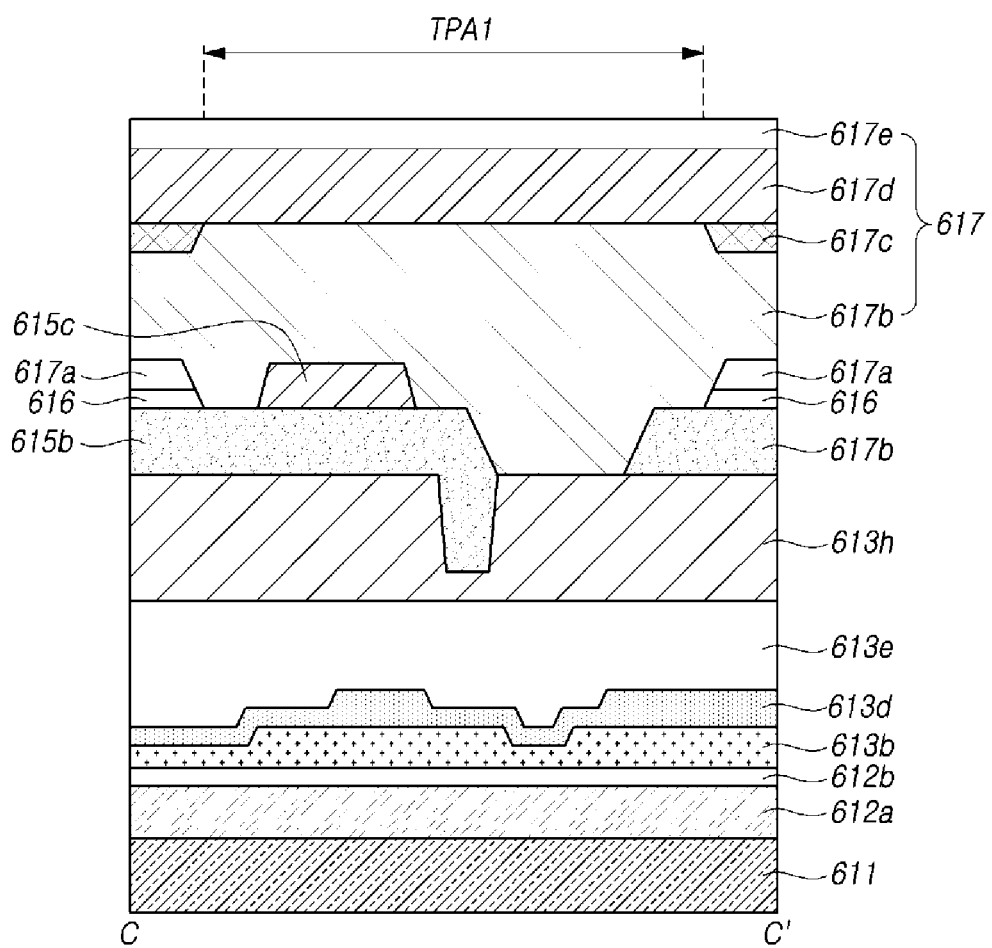
FIG. 9 is another cross-sectional view taken along line C-C' of the organic light-emitting display device illustrated in FIG. 4A.

FIG. 9 is another cross-sectional view taken along line C-C' of the organic light-emitting display device illustrated in FIG. 4A.

Referring to FIG. 9, the transmission area of the organic light-emitting display device 400 may include a back plate 611, a substrate 612a disposed on the back plate 611, a buffer layer 612b disposed on the substrate 612a, a gate insulation film 613b disposed on the buffer layer 612b, an interlayer insulation film 613d disposed on the gate insulation film 613b, a first passivation film 613e disposed on the interlayer insulation film 613d, and a first planarization film 613h disposed on the first passivation film 613e.

The transmission area may include a bank 615b disposed on the first planarization film 613h, a spacer 615c disposed on one region of the bank 615b, an organic film 617b disposed on the first planarization film 613h, a second adhesive layer 617d disposed on the organic film 617b, and a barrier film 617e disposed on the second adhesive layer 617d.

The substrate 612 may comprise a polyamide. However, the present disclosure is not limited thereto. The buffer layer 612b may include a multi-buffer layer and an active buffer layer. The active layer 613a and the gate insulation film 613b disposed on the substrate 612 may be disposed on the active buffer layer. The active layer 613, the cathode electrode, the source electrode, the drain electrode, the anode electrode, illustrated in FIG. 6, are not disposed in the transmission areas TPA1 and TPA2 of the organic light-emitting display device as described above, the transmittance of the transmission areas can be higher than that of the non-transmission area NPTA. That is, the number of conductive films stacked in the transmission areas TPA1 and TPA2 can be smaller than the number of conductive films stacked in the non-transmission area.

The organic film 617b, the second adhesive layer 617d and the barrier film 617e may correspond to the encapsulation layer 617 illustrated in FIG. 8. That is, the encapsulation layer 617 in the transmission areas TPA1 and TPA2 may not include the second passivation film 517a and the third passivation film 517c illustrated in FIG. 6. The second passivation film 517a and the third passivation film 517c may be inorganic films. If none of the second passivation film 517a and the third passivation film 517c is disposed, the transmittance of the encapsulation layer 617 can be higher.

Figure 10:
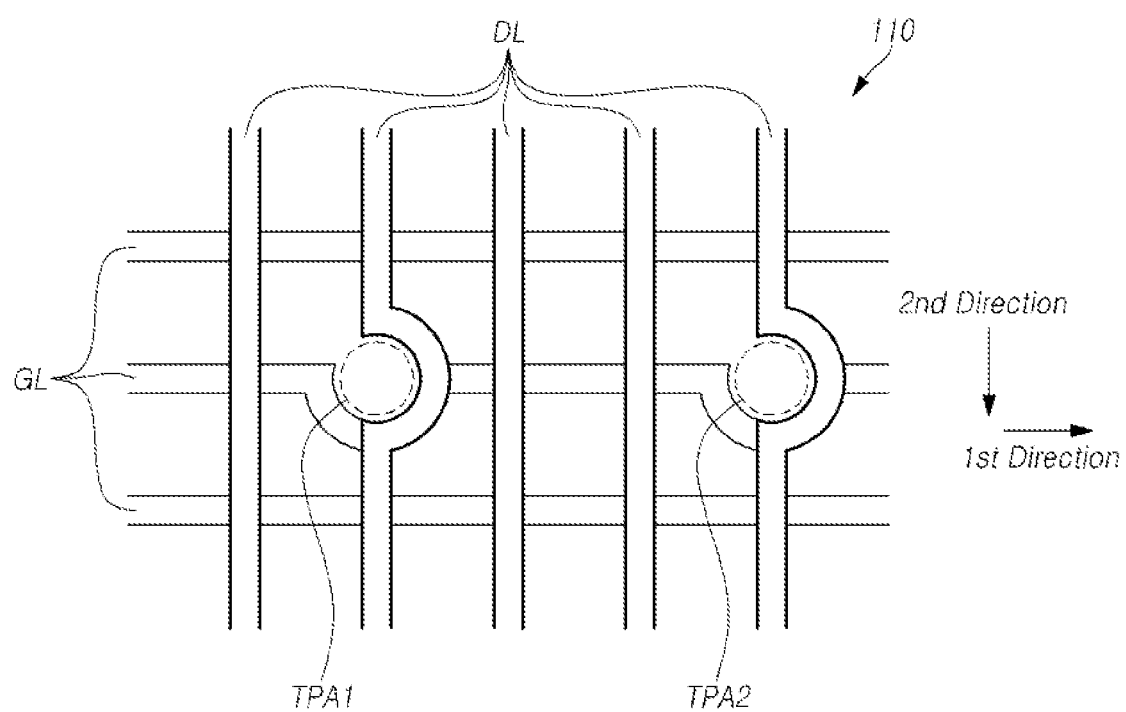
FIG. 10 is a top view illustrating the arrangement of data lines and gate lines in the organic light-emitting display device including the transmission area illustrated in FIG. 1.

FIG. 10 is a top view illustrating the arrangement of data lines and gate lines in the organic light-emitting display device including the transmission area illustrated in FIG. 1.

Referring to FIG. 10, the display panel 110 illustrated in FIG. 1 may include a plurality of gate lines GL arranged in a first direction and a plurality of data lines DL arranged in a second direction different from the first direction.

The transmission areas TPA1 and TPA2 may be disposed on the display panel 110. The transmission areas TPA1 and TPA2 may be areas of the plurality of conductive films, on which at least one of the gate lines GL, the data lines DL, and a combination thereof, is not deposited.

In addition, a portion of the non-transmission area NPTA may be disposed in the first direction of the transmission areas TPA1 and TPA2. The first direction of the transmission areas TPA1 and TPA2 is the direction in which the gate line GL extends. The pixels disposed in the non-transmission area NPTA, provided in the first direction of the transmission areas TPA1 and TPA2, can emit light.

At least one of the gate line GL and the data line DL may bypass the transmission areas TPA1 and TPA2. The conductive film is not disposed in the transmission areas TPA1 and TPA2, such that the gate lines and the data lines are not provided in positions overlapping the transmission areas TPA1 and TPA2. When the gate lines GL and the data lines DL are not provided such that the gate lines GL and the data lines DL are disconnected in positions corresponding to the transmission areas TPA1 and TPA2, the gate signal and the data signal may not be transmitted to the gate lines GL and the data lines DL, respectively. Therefore, there may be a problem in that the pixels arrayed in the first direction of the transmission areas TPA1 and TPA2 are not able to receive the gate signals, and the pixels arrayed in the second direction of the transmission areas TPA1 and TPA2 are not able to receive the data signals.

In order to solve this problem, the gate line GL extending in the first direction and the data line DL extending in the second direction may be arranged so as to bypass the transmission areas TPA1 and TPA2. Even if the gate line GL and the data line DL are not arranged in the transmission areas TPA1 and TPA2, the gate line GL and the data line GL may be arranged without being disconnected, due to the bypassing of the gate line GL and the data line DL. Although both the gate line GL and the data line DL are illustrated as bypassing the transmission areas TPA1 and TPA2, the present disclosure is not limited thereto. Rather, one of the gate line GL and the data line DL may bypass the transmission areas TPA1 and TPA2. In addition, although the areas in which the gate line GL and the data line DL overlap each other are illustrated as respectively having the same size as a single transmission area TPA1 or TPAs, the present disclosure is not limited thereto.

Figure 11:
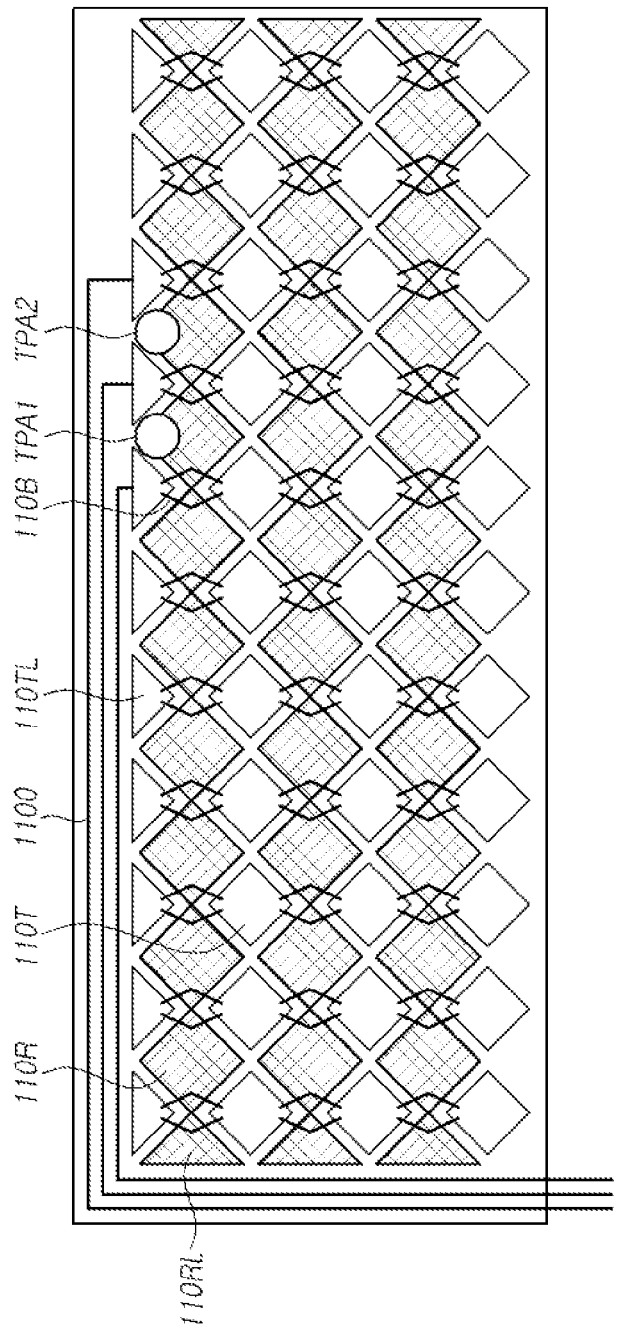
FIG. 11 is a top view illustrating an aspect of a touch sensor employed in the organic light-emitting display device illustrated in FIG. 1.
Figure 12:
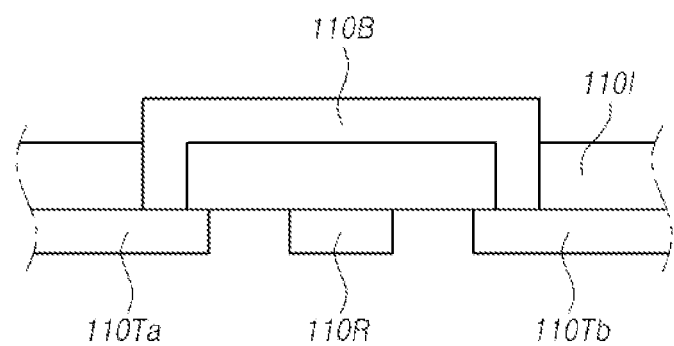
FIG. 12 is a cross-sectional view illustrating an aspect of a bridge employed in the touch sensor according to the present disclosure.

FIG. 11 is a top view illustrating an aspect of the touch sensor employed in the organic light-emitting display device illustrated in FIG. 1, and FIG. 12 is a cross-sectional view illustrating an aspect of the bridge employed in the touch sensor according to the present disclosure.

Referring to FIG. 11, the touch sensor 1110 may include a plurality of touch driving electrode lines 110TL arranged in a first direction and a plurality of touch sensing electrode lines 110RL arranged in a second direction. The touch sensor 1110 may correspond to the touch electrode layer 518 or 618 illustrated in FIG. 5 or FIG. 8. Each of the touch driving electrode lines 110TL may include a plurality of touch driving electrodes 110T, and each of the touch sensing electrode lines 110RL may include a plurality of touch sensing electrodes 110R.

In addition, the touch sensor 1110 may include a single touch driving electrode line 110TL to which the plurality of touch driving electrodes 110T are connected. Further, the touch sensor 1110 may include a single touch sensing electrode line 110RL to which the plurality of touch sensing electrodes 110R are connected. Here, the first direction may be a vertical direction, and the second direction may be a horizontal direction. However, the present disclosure is not limited thereto.

The plurality of touch driving electrodes 110T and the plurality of touch sensing electrodes 110R may have a rhombic shape. However, the present disclosure is not limited thereto. The touch driving electrodes 110R of the touch driving electrode lines 110TL may be connected to each other via bridges 110B so as not to be connected in an area in which the touch driving electrode lines 110TL and the touch sensing electrode lines 110RL intersect each other. In contrast, in case of the touch sensing electrode lines 110RL, the touch sensing electrodes 110R may be connected to each other on the same layer. As illustrated in FIG. 12, an insulation film 110I may be disposed on the touch driving electrode 110T, and the bridge 110B may be disposed on the insulation film 110I.

Figure 13A:
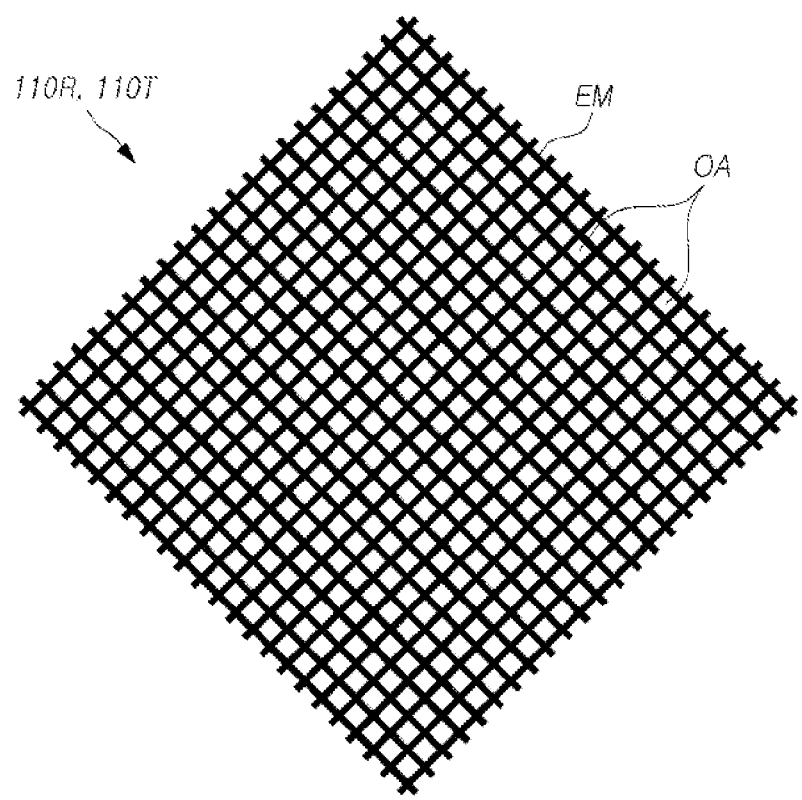
FIG. 13A is a top view illustrating an aspect of a touch electrode according to the present disclosure.

The bridges 110B may be connected to the touch driving electrodes 110Ta and 110Tb, respectively, through contact holes formed in the insulation film 110I. Each of the touch driving electrodes 110T of the touch driving electrode lines 110TL or each of the touch sensing electrodes 110R of the touch sensing electrode lines 110RL may be arranged in the form of a single conductive film. Each of the touch driving electrodes 110T of the touch driving electrode lines 110TL or each of the touch sensing electrodes 110R of the touch sensing electrode lines 110RL has a pattern in which the touch driving electrode 110T or the touch sensing electrode 110R may be arranged in a mesh form as illustrated in FIG. 13A.

Figure 13B:
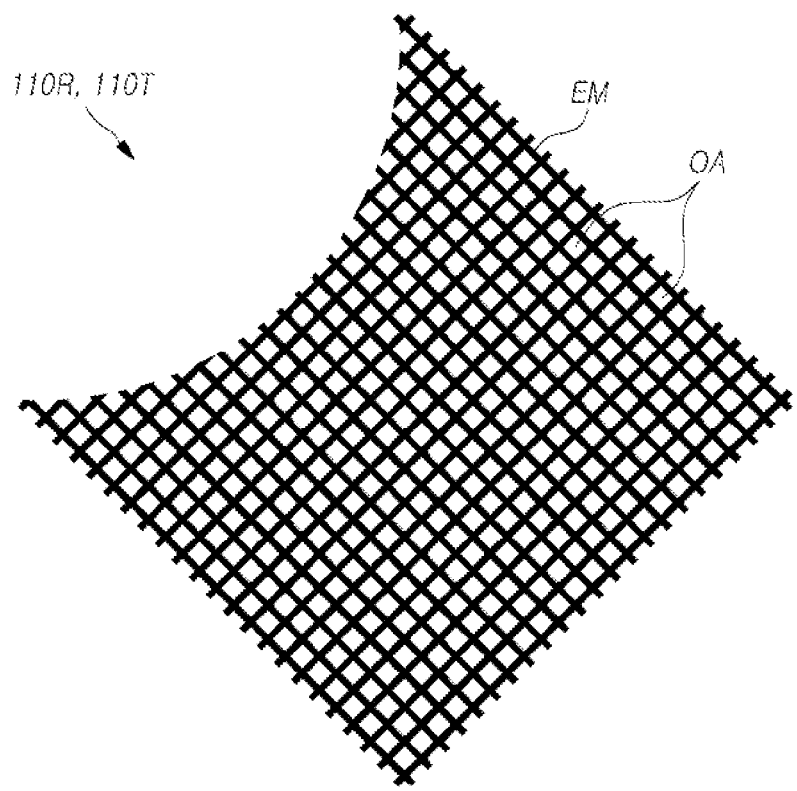
FIG. 13B is a top view illustrating an aspect in which a portion of a pattern of the touch electrode is removed according to the present disclosure.

The mesh may include a plurality of intersecting conductive lines EM and open areas OA arranged to correspond to the intersecting areas. Then, a portion of the pattern may be removed, as illustrated in FIG. 13B, so as to correspond to the transmission areas TPA1 and TPA2 of the organic light-emitting display device 400 illustrated in FIG. 4A. The pattern may be removed by preventing the touch driving electrode 110T or the touch sensing electrode 110R from being patterned in a position corresponding to the transmission areas TPA1 and TPA2 of the organic light-emitting display device illustrated in FIG. 3 when the touch driving electrode 110T and the touch sensing electrode 110R are fabricated by a mask process. Accordingly, the removal of the pattern can prevent light from being reflected by at least one of the touch driving electrode 110T, the touch sensing electrode 110R, or a combination thereof, thereby further increasing the transmittance of the organic light-emitting display device 400.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. An organic light-emitting display device comprising:
 a display panel having an active area; and
 a sensor package module disposed on a rear surface of the display panel;
 an organic light-emitting diode disposed in the display panel;
 an encapsulation layer disposed on the organic light-emitting diode,
 wherein the active area comprises a transmittance area through which external light passes, and a non-transmittance area disposed around the transmittance area in the active area,
 wherein the sensor package is disposed to correspond to the transmittance area,
 a plurality of gate lines arranged in a first direction and a plurality of data lines arranged in a second direction different from the first direction on the display panel,
 wherein the encapsulation layer in the non-transmittance area includes a transparent organic layer extended from the transmittance area and the transparent organic layer in the non-transmittance area is disposed between first and second inorganic layers,
 wherein the encapsulation layer in the transmittance area includes only a transparent organic layer and the first and second inorganic layers are not disposed in the transmittance area where the external light vertically passes through the display panel including the transparent organic layer with respect to top and bottom surfaces of the display panel, and
 wherein each of the first and second inorganic layers includes an opening which overlaps with the transmittance area.

2. The organic light-emitting display device according to claim 1, wherein the sensor package module comprises:
 a light emitter corresponding to the transmittance area to emit infrared radiation;
 an infrared sensor corresponding to the transmittance area to receive the infrared radiation emitted by the light emitter; and
 a proximity sensor corresponding to the transmittance area and receiving visible light.

3. The organic light-emitting display device according to claim 1, wherein the organic light-emitting diode includes:
 an element layer including a transistor having conductive films; and
 a light-emitting layer disposed on the element layer to emit light by receiving a driving current from the element layer,
 wherein the light-emitting layer includes a light-emitting element having an anode electrode and a cathode electrode stacked in the conductive films.

4. The organic light-emitting display device according to claim 3, wherein the cathode electrode is not deposited in the transmittance area.

5. The organic light-emitting display device according to claim 1, wherein at least one of the gate lines and the data lines is not disposed in the transmittance area.

6. The organic light-emitting display device according to claim 5, wherein a portion of the non-transmittance area is disposed in the second direction of the transmittance area.

7. The organic light-emitting display device according to claim 5, wherein the at least one of the gate line and the data line, or a combination thereof, bypasses the transmittance area.

8. The organic light-emitting display device according to claim 1, wherein the display panel comprises:
 a substrate; and
 a bezel area disposed around the active area,
 wherein the active area includes a plurality of pixels arrayed on the substrate.

9. The organic light-emitting display device according to claim 1, further comprising a touch sensor having a plurality of touch electrodes is disposed on the display panel to detect a touch, wherein the touch electrodes do not overlap with the transmittance area in the active area.

10. An organic light-emitting display device comprising:
 a display panel where a transmittance area and a non-transmittance area are defined,
 wherein the display panel comprises a plurality of gate lines arranged in a first direction and a plurality of data lines arranged in a second direction different from the first direction, and at least one of the gate lines and the data lines bypasses the transmittance area;
 a data driver supplying a data signal to the display panel;
 a gate driver supplying a gate signal to the display panel;
 a timing controller controlling the data driver and the gate driver;
 a sensor package module disposed on a rear surface of the display panel and disposed to correspond to the transmittance area;
 an organic light-emitting diode disposed in the display panel;
 an encapsulation layer disposed on the organic light-emitting diode,
 wherein the encapsulation layer in the non-transmittance area includes a transparent organic layer extended from the transmittance area and the transparent organic layer in the non-transmittance area is disposed between first and second inorganic layers, and
 wherein the encapsulation layer in the transmittance area includes the transparent organic layer extended from the non-transmittance area and the first and second inorganic layers are not disposed in the transmittance area where external light vertically passes through the display panel including the transparent organic layer with respect to top and bottom surfaces of the display panel, and
 wherein each of the first and second inorganic layers includes an opening which overlaps with the transmittance area.

11. The organic light-emitting display device according to claim 10, wherein the sensor package module comprises:
 a light emitter corresponding to the transmittance area to emit infrared radiation;
 an infrared sensor corresponding to the transmittance area to receive the infrared radiation emitted by the light emitter; and
 a proximity sensor corresponding to the transmittance area and receiving visible light.

12. The organic light-emitting display device according to claim 10, wherein the organic light-emitting diode includes:
 an element layer including a transistor having conductive films; and a light-emitting layer disposed on the element layer to emit light by receiving a driving current from the element layer, wherein the light-emitting layer includes a light-emitting element having an anode electrode and a cathode electrode stacked in the conductive films.

13. The organic light-emitting display device according to claim 12, wherein the cathode electrode is not deposited in the transmittance area.

14. The organic light-emitting display device according to claim 10, wherein a portion of the non-transmittance area is disposed in the second direction of the transmittance area.

15. The organic light-emitting display device according to claim 10, wherein the display panel comprises:

a substrate; and an active area including a plurality of pixels arrayed on the substrate; and a bezel area disposed around the active area, wherein the transmittance area is disposed in an area of the active area.

16. The organic light-emitting display device according to claim 15, further comprising a touch sensor having a plurality of touch electrodes is disposed on the display panel to detect a touch, wherein the touch electrodes do not overlap with the transmittance area in the active area.

* * * * *